(12) United States Patent
Ishikawa (10) Patent No.: US 10,736,251 B2
(45) Date of Patent: Aug. 4, 2020

(54) MOUNTING DEVICE (71) Applicant: FUJI CORPORATION, Chiryu (JP)

(72) Inventor: Nobuyuki Ishikawa, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/325,419

(22) PCT Filed: Aug. 24, 2016

(86) PCT No.: PCT/JP2016/074687
§ 371 (c)(1),
(2) Date: Feb. 14, 2019

(87) PCT Pub. No.: WO2018/037507
PCT Pub. Date: Mar. 1, 2018

(65) Prior Publication Data
US 2019/0200497 A1   Jun. 27, 2019

(51) Int. Cl.
| H05K 13/08 | (2006.01) |
| G03B 7/00 | (2014.01) |
| H05K 13/04 | (2006.01) |
| H04N 5/235 | (2006.01) |

(52) U.S. Cl.
CPC .......... *H05K 13/0812* (2018.08); *G03B 7/00* (2013.01); *H04N 5/2353* (2013.01); *H05K 13/0408* (2013.01); *H05K 13/0409* (2018.08); *H05K 13/0882* (2018.08); *H05K 13/0419* (2018.08)

(58) Field of Classification Search
None
See application file for complete search history.

(56) References Cited

U.S. PATENT DOCUMENTS

2015/0049183 A1   2/2015   Yamakage et al.

FOREIGN PATENT DOCUMENTS

| EP | 2 838 333 A1 | 2/2015 | |
| EP | 2 882 272 A1 | 6/2015 | |
| EP | 2 925 112 A1 | 9/2015 | |
| EP | 2925112 A1 * | 9/2015 | ......... H05K 13/0812 |
| JP | 7-221497 A | 8/1995 | |
| WO | WO 2014/080474 A1 | 5/2014 | |

OTHER PUBLICATIONS

International Search Report dated Nov. 29, 2016 in PCT/JP2016/074687 filed on Aug. 24, 2016.

* cited by examiner

*Primary Examiner* — Heather R Jones
(74) *Attorney, Agent, or Firm* — Oblon, McClelland, Maier & Neustadt, L.L.P.

(57) ABSTRACT

A CPU of a controller of a mounting device determines an aperture and a light exposure time so that tip portion falls within the depth of field (DOF) of component camera based on information about the height of tip portion which is an imaging target portion in component and controls component camera so as to image the component with the determined aperture and light exposure time.

3 Claims, 5 Drawing Sheets

MOUNTING DEVICE

TECHNICAL FIELD

The present application relates to a mounting device.

BACKGROUND ART

Conventionally, a mounting device has been known in which a component supplied from a feeder is picked up by suction with the tip of a nozzle, and the nozzle is moved to an area above a camera whereby the camera captures the image of the component, and then the nozzle is moved to an area above a board to mount the component at a predetermined position on the board. For example, in Patent Literature 1, a camera performs imaging in a state in which the lower face of a component picked up by a nozzle is raised to a predetermined height.

PATENT LITERATURE

Patent Literature 1: JP-A-Hei7-221497

BRIEF SUMMARY

Technical Problem

However, in Patent Literature 1, due to the fixed distance between the lower face of the component and the camera, a suitable image may not be obtained for some types of the components. For example, if an imaging target portion of the component is located at a height different from the lowest portion of the component with the focusing distance being constant and equal to the distance between the lowest portion of the component and the camera, the imaging target portion may deviate from the depth of field of the camera, resulting in capturing an image being out of focus with respect to the imaging target portion.

The present disclosure has been made to solve the above-mentioned problem, and its main object is to obtain a suitable image of the component.

Solution to Problem

The present disclosure employs the following means in order to achieve the main object described above.

A mounting device of the present disclosure comprises: a component holding section capable of holding a component; an imaging section capable of imaging a component held in the component holding section from above or below and capable of adjusting an aperture and a light exposure time at the time of imaging; and a control section configured to obtain information about height of an imaging target portion of the component, determine imaging conditions relating to the aperture and the light exposure time so that the imaging target portion falls within the depth of field of the imaging section based on the obtained information, and control the imaging section so as to image the component under the determined imaging conditions.

In the mounting device, the aperture and the light exposure time are set, based on information about the height of the imaging target portion of the component, so that the imaging target portion falls within the depth of field of the imaging section, and image of the component is captured with the setting aperture and light exposure time. As described above, since the image is captured by adjusting the depth of field based on the information about the height of the imaging target portion of the component, it is possible to obtain an image focused on the imaging target portion regardless of whether the height of the imaging target portion of the component matches the end portion thereof facing to the imaging section side. That is, a suitable image of the component can be obtained. The end portion of the imaging section side is the highest portion of the component when the imaging section images the component from above, and is the lowest portion of the component when the imaging section images the component from below.

The mounting device of the present disclosure further comprises: a lifting and lowering section capable of adjusting an imaging distance, which is a distance at the time of imaging in the height direction from the component end portion of the imaging section side to the imaging section, by lifting and lowering at least one of the component held by the component holding section and the imaging section; wherein the control section obtains at least information about difference between the height of the component end portion on the imaging section side and the height of the imaging target portion as information on the height of the imaging target portion; and in a case that the difference based on the obtained information is included in a first region, among a first region and a second region with a larger difference than included in the first region, the control section may control the image section to capture an image of the component under an imaging condition in which the aperture is more opened and the light exposure time is shorter than a case of the difference being in the second region, and may control the lifting and lowering section to adjust the imaging height so that the imaging target portion falls within the depth of field of the imaging condition; and if the difference is included in the second region, the control section determines the imaging condition so that the imaging target portion falls within the depth of field of the imaging section, and controls the imaging section to capture an image of the component under the determined imaging condition. In this way, when the difference between the height of the component end portion of the imaging section side and the height of the imaging target portion is included in the first region (i.e., when the difference is relatively small), the imaging distance is adjusted by the lifting and lowering section so that the imaging target portion falls within the depth of field even in a state in which the depth of field is relatively shallow. Therefore, it is possible to capture an image in a state in which the depth of field is made relatively shallow, that is, in an imaging condition in which the light exposure time can be made relatively short, which enables to obtain the image at high speed. On the other hand, when the difference between the height of the component end portion of the imaging section side and the height of the imaging target portion is included in the second region (i.e., when the difference is relatively large), the image of the component is captured in a state in which the aperture is reduced while the light exposure time is lengthened, and as a result, with the imaging distance being adjusted only with the lifting and lowering section, the imaging target portion may fall within the depth of field even in a case of the component end portion of the imaging section side being interfered with the imaging section, for example. Therefore, even when the difference between the height of the component end portion of the imaging section side and the height of the imaging target portion is large, the image focused on the imaging target portion can be more reliably obtained.

In the mounting device of the present disclosure in which different actions are performed depending on whether the difference is included in the first region or the second region, when the difference is included in the first region, the control section may control the imaging section so as to image the component with the aperture and the light exposure time in the same state regardless of the difference. Thus, when the difference is included in the first region, the light exposure time can be shortened as much as possible regardless of the magnitude of the difference, and an image can be obtained at high speed.

In the mounting device of the present disclosure, in which different actions are performed depending on whether the difference is included in the first region or the second region, when the difference is included in the second region, the control section may control the lifting and lowering section so as to adjust the imaging distance such that the difference is equal to or less than the minimum value of the imaging distance when the difference is included in the first region. In this way, the lifting and lowering section makes the imaging distance relatively small even when the difference is included in the second region, by which the imaging target portion may fall within the depth of field, even when the difference is relatively large, without having to make the depth of field as deep as possible, that is, without having to make the light exposure time as long as possible.

DESCRIPTION OF EMBODIMENT

Figure 1:
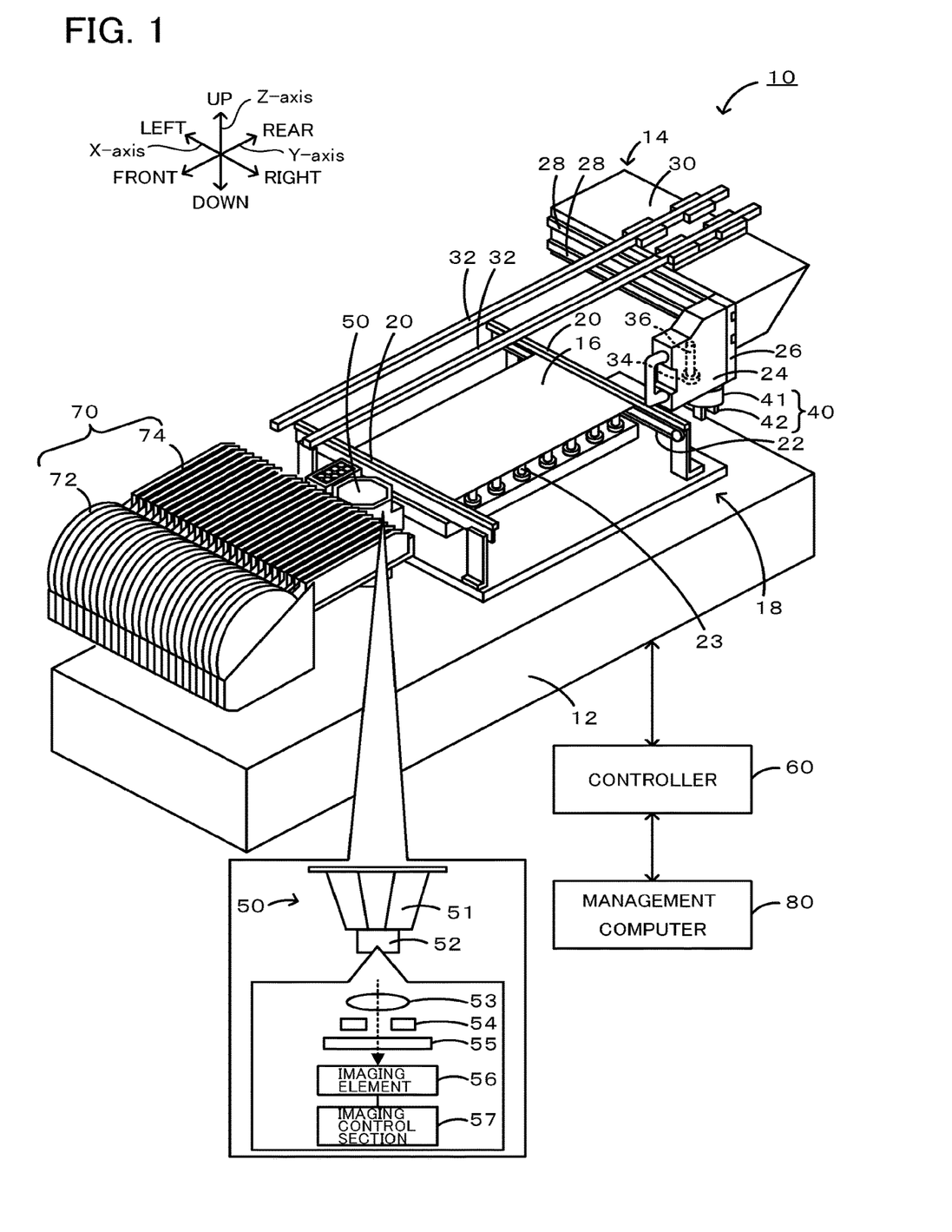
FIG. 1 is a perspective view of mounting device 10.
Figure 2:
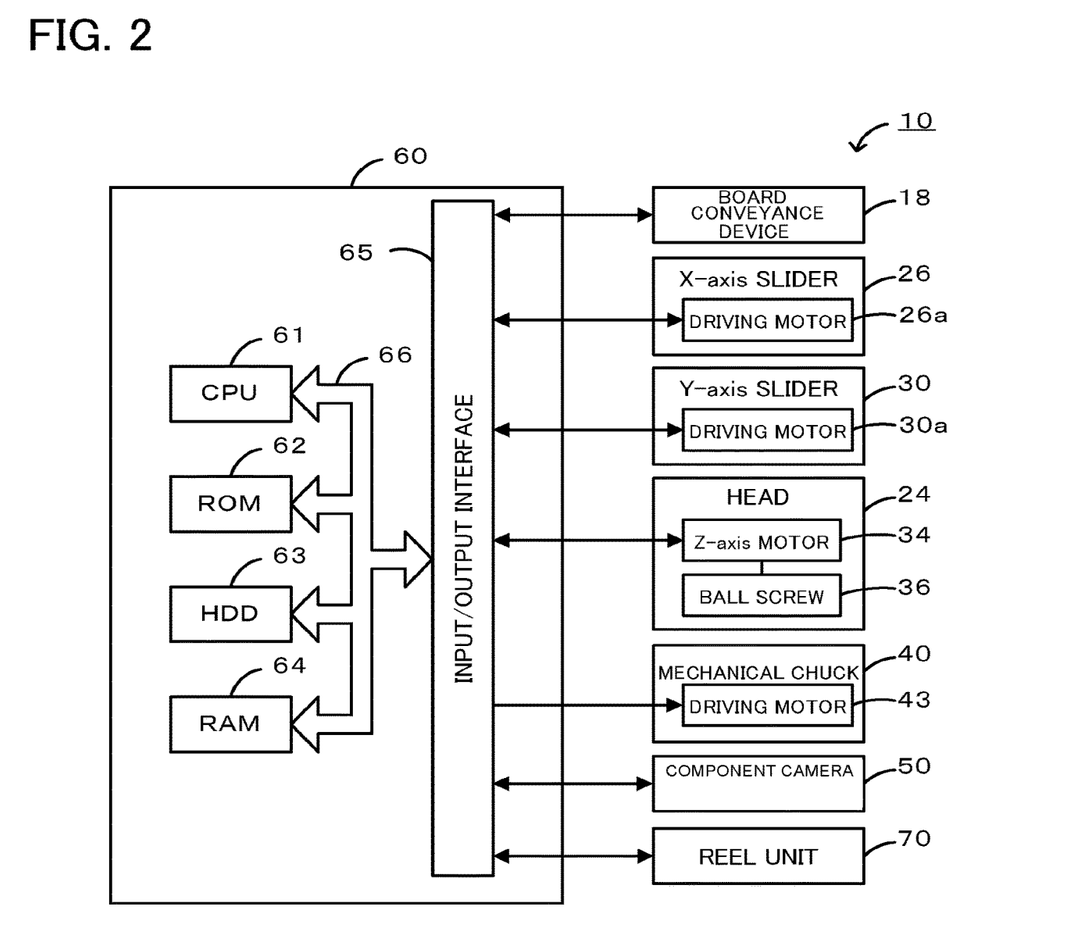
FIG. 2 is a block diagram showing a configuration involved in the control of mounting device 10.

An embodiment of the present disclosure are described below with reference to the drawings. FIG. 1 is a perspective view of mounting device 10, and FIG. 2 is a block diagram showing a configuration involved in the control of mounting device 10. In the present embodiment, the left-right direction (X-axis), the front-rear direction (Y-axis), and the vertical direction (Z-axis) are as shown in FIG. 1.

Mounting device 10 includes base 12, mounting device main body 14 installed on base 12, and reel unit 70 as a component supply device mounted on mounting device main body 14.

Mounting device main body 14 is installed on base 12 in an exchangeable manner. Mounting device main body 14 includes board conveyance device 18 for conveying and holding board 16, head 24 movable in the XY plane, mechanical chuck 40 attached to head 24 and movable in the Z-axis, component camera 50 for imaging a component held by mechanical chuck 40, and controller 60 for executing various controls.

Board conveyance device 18 includes two support plates 20, 20 disposed in the front-rear direction in FIG. 1 with a space in between and extend in the left-right direction, and conveyor belts 22, 22 (only one of which is shown in FIG. 1) which are disposed on surfaces of the support plates 20, 20 which face each other. Conveyor belts 22, 22 are spanned over drive wheels and driven wheels disposed on the left and right of support plates 20, 20 such that conveyor belts 22, 22 form endless loops. Board 16 is conveyed from left to right on the upper surfaces of conveyor belts 22, 22. Board 16 is supported from the rear face by multiple upright support pins 23.

Head 24 is attached to the front surface of X-axis slider 26. X-axis slider 26 is attached to the front surface of Y-axis slider 30, which is slidable in the front-rear direction, so as to be slidable in the left-right direction. Y-axis slider 30 is slidably attached to a pair of left and right guide rails 32, 32 extending in the front-rear direction. A pair of upper and lower guide rails 28, 28 extending in the left-right direction are disposed on the front surface of Y-axis slider 30, and X-axis slider 26 is attached to the pair of guide rails 28, 28 so as to be slidable in the left-right direction. Head 24 moves in the left-right direction as X-axis slider 26 moves in the left-right direction, and head 24 moves in the front-rear direction as Y-axis slider 30 moves in the front-rear direction. Sliders 26, 30 are driven by driving motors 26a, 30a (see FIG. 2), respectively. Head 24 includes Z-axis motor 34, and the height of mechanical chuck 40 attached to ball screw 36, which extends along the Z-axis, is adjusted by Z-axis motor 34.

Mechanical chuck 40 is a mechanism capable of holding a component by gripping the component. Mechanical chuck 40 includes chuck main body 41, mounted so as to be relatively movable in the Z-axis direction with respect to head 24, and front-rear gripping section 42 mounted below chuck main body 41. Mechanical chuck 40 includes slider (not shown) attached to the bottom surface of chuck main body 41, which enables gripping section 42 to be slidable in closing and separating directions, and driving motor 43 for driving the slider. Gripping sections 42 grip a component by being brought close to each other by driving motor 43. Further, the height of the component gripped by gripping section 42 is adjusted by way of mechanical chuck 40 being moved up and down along the Z-axis direction by Z-axis motor 34.

Component camera 50 is disposed in front of support plate 20 on the front of board conveyance device 18. Component camera 50 has an image capturing field above component camera 50 and generates an image by capturing an image from below of a component held by mechanical chuck 40. As shown in FIG. 1, component camera 50 includes light section 51 having multiple LEDs mounted on an inner surface of a housing having a truncated inverted octagonal pyramid-shape with upper and lower surfaces open, and camera main body 52 disposed below the housing. Camera main body 52 includes lens 53, aperture mechanism 54, shutter mechanism 55, imaging element 56, and an imaging control section 57. The amount of light that passes through lens 53 and enters imaging element 56 is adjusted by aperture mechanism 54. Lens 53 and aperture mechanism 54 are separated from imaging element 56 by shutter mechanism 55, and shutter mechanism 55 adjusts the light exposure time of imaging element 56 at the time of image capturing by switching between allowing light to pass through lens 53 or shielding the light. Although only one lens 53 is illustrated in FIG. 1, multiple lenses 53 may be included in component camera 50. When imaging element 56 receives light after passing through lens 53, aperture mechanism 54, and shutter mechanism 55, the light undergoes photoelectric conversion to produce individual charges corresponding to each pixel in the image. Imaging element 56 may be, for example, a CMOS image sensor. Imaging control section 57 reads out electric charges generated by imaging element 56, and generates image data, which is digital data including information for each pixel. Imaging control section 57 provides overall control of component camera 50. Specifically, imaging control section 57 outputs a control signal to light section 51 to control the irradiation of light from light section 51, outputs a control signal to aperture mechanism 54 to adjust the aperture, or outputs a control signal to shutter mechanism 55 to adjust the light exposure time at the time of imaging. Imaging control section 57 outputs the generated image data to controller 60.

As shown in FIG. 2, controller 60 is configured as a microprocessor with CPU 61 as the centerpiece, and includes ROM 62 for storing process programs, HDD 63 for storing various data, RAM 64 used as a work region, input/output interface 65 for exchanging electrical signals with external devices, and the like, which are connected via bus 66. Controller 60 outputs drive signals to board conveyance device 18, driving motor 26a of X-axis slider 26, driving motor 30a of Y-axis slider 30, and driving motor 43 of mechanical chuck 40. Further, controller 60 outputs information regarding the aperture and light exposure time as imaging conditions at the time of imaging to component camera 50 and receives image data from component camera 50. Although not shown, sliders 26 and 30 are equipped with position sensors (not shown), and controller 60 controls driving motors 26a and 30a of sliders 26 and 30 while inputting position information from the position sensors.

Reel unit 70 includes multiple reels 72, and is detachably attached to the front side of mounting device main body 14. Tape is wound around each reel 72, and components are held on the surface of the tape along the longitudinal direction of the tape. These components are protected by a film covering the surface of the tape. The tape is unwound rearwardly from the reel and the film is peeled off at feeder section 74 to expose a component. When gripping section 42 of mechanical chuck 40 grips the exposed component, the component is held by mechanical chuck 40 and can move together with head 24.

Management computer 80 is a computer configured to manage a production job of mounting device 10, and is communicably connected to controller 60 of mounting device 10. The production job constitutes information defining which components are mounted on which board 16 and in what sequence, the number of boards 16 components are to be mounted on, and the like in mounting device 10. Management computer 80 stores the production job, and outputs information included in the production job to mounting device 10 as necessary.

Figure 3:
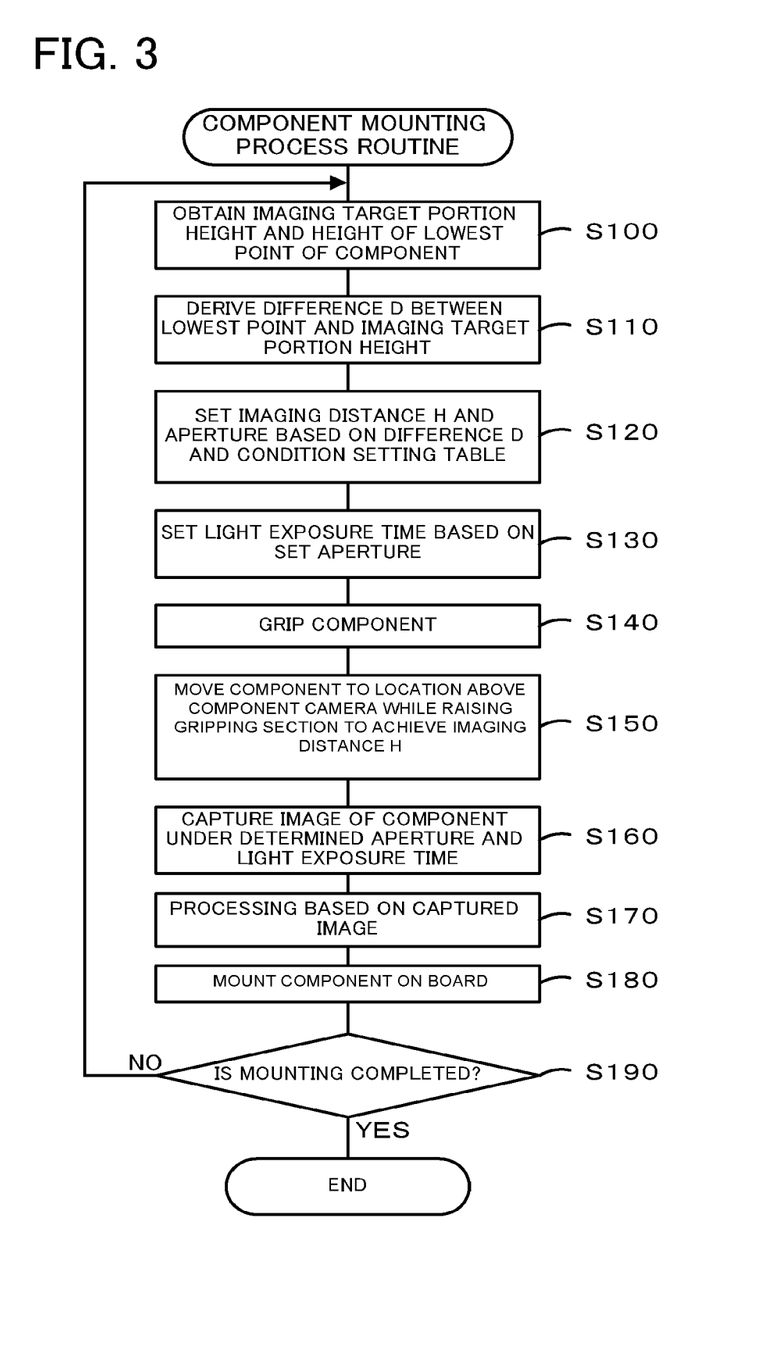
FIG. 3 is a flowchart of a component mounting process routine.
Figure 4:
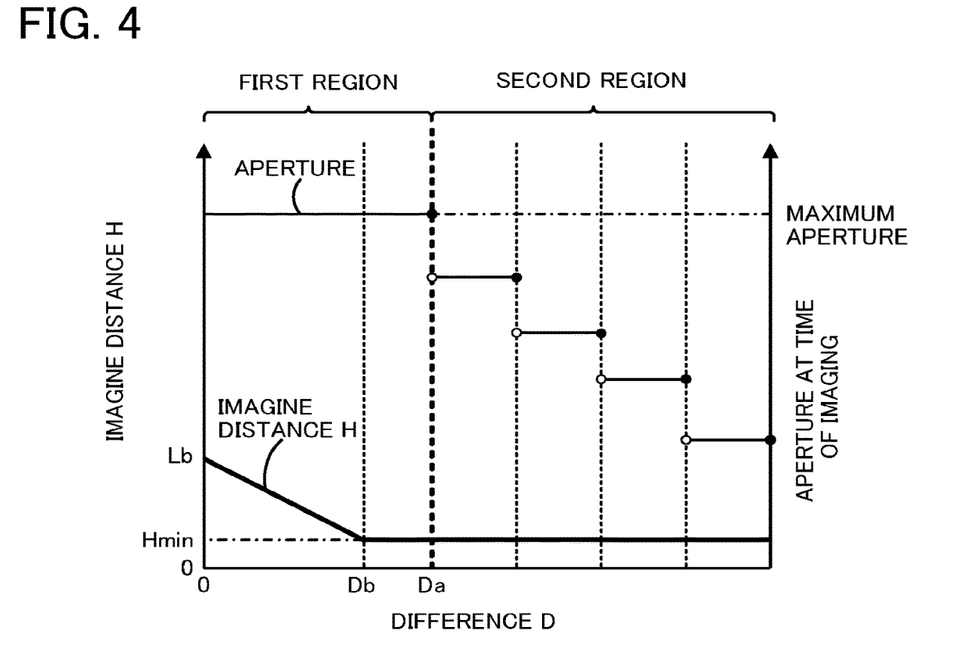
FIG. 4 is a diagram of a condition setting table.
Figure 5:
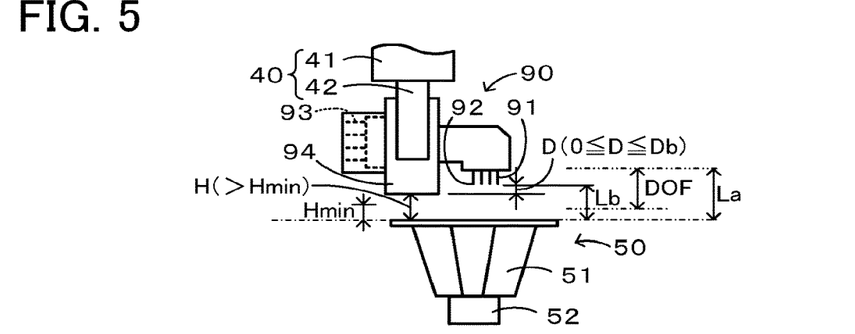
FIG. 5 is a view of the positional relationship between the depth of field and tip portion 92 when $0 \leq D \leq Db$.
Figure 6:
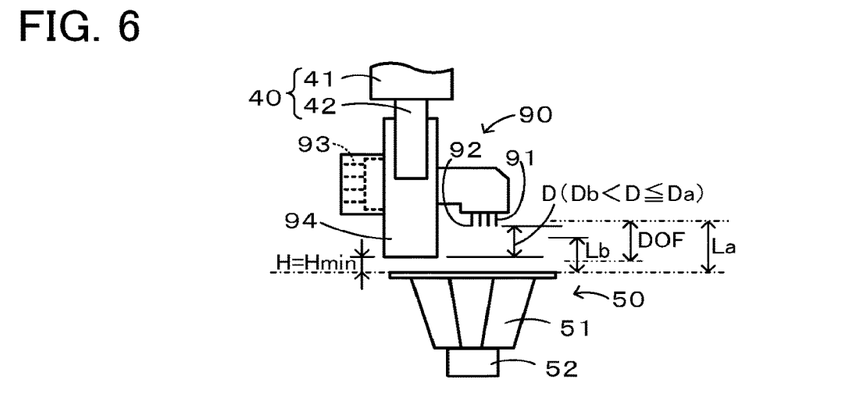
FIG. 6 is a view of the positional relationship between the depth of field and tip portion 92 when $Db < D \leq Da$.
Figures 7, 8:
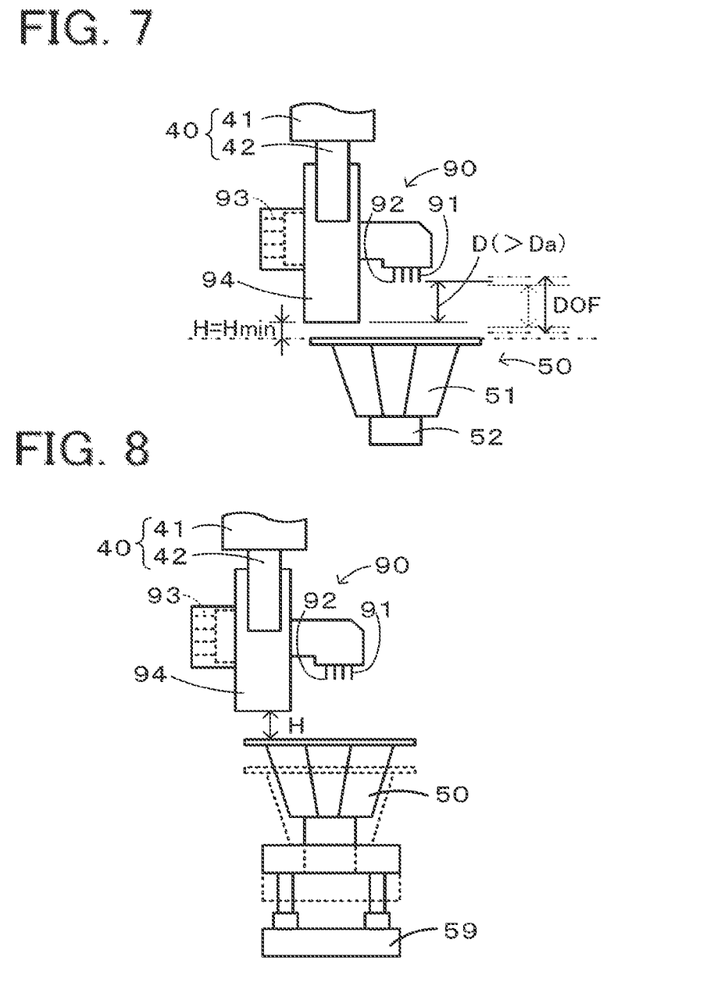
FIG. 7 is a view of the positional relationship between the depth of field and tip portion 92 when $Da < D$.
FIG. 8 is a view of a mode in which component camera 50 is raised and lowered.

Next, an operation of mounting device 10 of the present embodiment, in particular, a process of mounting a component on board 16 while imaging the component by using component camera 50 will be described. FIG. 3 is a flowchart showing an example of the component mounting process routine. FIG. 4 is a diagram of a condition setting table. FIGS. 5 to 7 are diagrams of the positional relationship between the depth of field of component camera 50 and tip portion 92, which is an imaging target portion in component 90. FIG. 5 is a diagram of a case in which 0≤D≤Db, FIG. 6 is a diagram of a case in which Db<D≤Da, and FIG. 7 is a diagram of a case in which Da<D. Difference D and values Da, Db will be described later. "DOF" in FIGS. 5 to 7 refers to Depth of Field. The component mounting process routine of FIG. 3 and the condition setting table of FIG. 4 are stored in HDD 63. The component mounting process routine of FIG. 3 is started by controller 60 upon receipt of a command from management computer 80.

When the component mounting process routine is started, CPU 61 of controller 60 first obtains information about the height of the imaging target portion of the mounting target component (step S100), which includes information about the height of the imaging target portion of the component and the height of the lowest portion of the component. Hereinafter, a case in which the mounting target component is component 90, shown in FIGS. 5 to 7, will be described as an example. Component 90 is a connector for electrically connecting multiple components. Component 90 includes multiple connector pins 91 to be inserted into board 16, and multiple connector pins 93 in one-to-one communication with multiple connector pins 91. Component 90 connects, for example, a component on board 16 to another component disposed at a position different from the upper portion of board 16 via connector pins 91, 93. The axial direction of connector pins 91 (i.e., the vertical direction in FIGS. 5 to 7) and the axial direction of connector pins 93 (i.e., the horizontal direction in FIGS. 5 to 7) are perpendicular to each other. Component 90 has protruding section 94 protruding lower than tip portion 92 of connector pins 91 (i.e., the lower end in FIGS. 5 to 7), and the lower end of protruding section 94 is the lowest portion of component 90. Imaging target portion in component 90 for component camera 50 is tip portion 92. In this manner, component 90 is positioned at a height at which the imaging target portion (i.e. tip portion 92) in component 90 is different from the lowest portion of component 90. The information about the imaging target portion height and the height of the lowest portion of component 90 is included in the manufacturing job, and CPU 61 obtains the information from management computer 80 in step S100. In the present embodiment, information about the height of the lowest portion is specifically the value of the thickness (i.e., the height) of the component, that is, the distance in the vertical direction from the highest portion of the component to the lowest portion (here, the lower end of protruding section 94). More specifically, the information about the imaging target height is the distance in the vertical direction from the highest portion of the component to the imaging target portion (here, tip portion 92). Not limited to component 90, information about the imaging target portion height and the height of the lowest portion for each component type is included in the production job.

Next, in step S110, CPU 61 derives difference D between the height of the lowest portion of the mounting target component and the height of the imaging target portion based on information obtained in step S100. For example, when the mounting target is component 90, as shown in FIGS. 5 to 7, the distance in the vertical direction between tip portion 92 and the lower end of protruding section 94 is derived as difference D. Next, CPU 61 determines imaging distance H and the aperture at the time of imaging based on derived difference D and the condition setting table as shown in FIG. 4 (step S120). Note that, as shown in FIGS. 5 to 7, imaging distance H is a distance in the vertical direction (i.e., the height direction) between the highest portion of component camera 50 and the lowest portion of the mounting target component (i.e., the lower end of protruding section 94 in the drawing). The condition setting table of FIG. 4 is a table including the correspondence between difference D and imaging distance H, and the correspondence between difference D and the aperture at the time of imaging. In step S120, CPU 61 reads imaging distance H and the aperture at the time of imaging linked to difference D in the condition setting table, and sets the read values for imaging distance H and the aperture at the time of imaging.

As a result, CPU 61 sets imaging distance H and the aperture at the time of imaging such that in addition to enabling accommodation of the imaging target portion in the component within the depth of field of component camera 50, the aperture is opened as much as possible and the component and component camera 50 are prevented from interfering with each other.

Next, the condition setting table will be described. As shown in FIG. 4, the condition setting table has a first region in which difference D is relatively small (i.e., 0≤D≤Da) and a second region in which difference D is relatively large (i.e., Da<D). Value Da is the boundary value between the first region and the second region, and is set as the upper limit value for difference D in which the imaging target portion of the component falls within the depth of field without interference between component camera 50 and the component when the aperture of aperture mechanism 54 of component camera 50 is set to the maximum aperture (i.e., the most open position). Incidentally, the depth of field becomes shallower as the aperture is increased, that is, the distance in the optical axis direction of component camera 50 between the position closest to component camera 50 and the position farthest from component camera 50 in the depth of field (i.e., the vertical distance between the upper end and lower ends of the depth of field in FIGS. 5 to 7), becomes smaller. Therefore, the maximum aperture state is a state in which the depth of field of component camera 50 is smallest. In this embodiment, distance Hmin (>0) is set as the lower limit of imaging distance H that avoids interference between component camera 50 and the component. Distance Hmin is the value obtained by adding a margin to the condition where component camera 50 contacts the component (imaging distance H=0) and is set to, for example, 1 mm. The CPU 61 assumes that interference between component camera 50 and the component is avoided by setting imaging distance H so that H≤Hmin. As described above, in the present embodiment, the value of difference D becomes value Da when the height-direction distance between the upper end of the depth of field at maximum aperture and the highest portion of component camera 50 (i.e., distance La shown in FIGS. 5 and 6) becomes equal to the sum of distance Hmin and difference D. That is, Da=La−Hmin. As shown in FIG. 4, in the condition setting table, when difference D is included in the first region, the aperture is linked to the same state (here, the maximum aperture) regardless of difference D. When difference D is included in the second region, the aperture tends to be smaller as difference D becomes larger, and difference D and the aperture are linked to each other. In the present embodiment, when difference D is included in the second region, difference D and the aperture are made to link to each other so that the aperture is reduced in a step-function manner as difference D becomes larger. Among the cases in which difference D is included in the first region or the second region, difference D and the aperture are linked to each other so that the aperture is more opened when difference D is included in the first region. In the condition setting table, when the difference D is included in the first region, imaging distance H tends to decrease as difference D increases, and difference D and imaging distance H are linked to each other. When difference D is included in the second region, imaging distance H has the same value (i.e., distance Hmin) regardless of difference D. Difference D and imaging distance H are linked so that imaging distance H in the case in which difference D is included in the second region is equal to or less than the smallest value (i.e., distance Hmin in FIG. 4) of imaging distance H in the case in which difference D is included in the first region (equal in FIG. 4).

In the condition setting table, the first region is divided into two areas depending on whether difference D is equal to or less than value Db (0<Db<Da) or greater than value Db. Value Db is set as the upper limit value of the value of difference D such that the height of the imaging target portion of the component can be made to coincide with the position in which the focus is clearest within the depth of field with the aperture of aperture mechanism 54 of component camera 50 being at maximum aperture. More specifically, the value of difference D becomes the value Db when the height-direction distance Lb, as shown in FIG. 5, between the highest portion of component camera 50 and a position at which the focus is particularly clear within the depth of field at the time of maximum aperture, becomes equal to the sum of distance Hmin and difference D. That is, Db=Lb−Hmin. In the condition setting table, when difference D is equal to or smaller than value Db, imaging distance H corresponding to difference D is equal to or larger than distance Hmin. When difference D is equal to or less than value Db, difference D and imaging distance H are linked to each other in such a way that imaging distance H tends to be smaller as difference D increases. More specifically, when difference D is equal to or less than value Db, the correspondence between difference D and imaging distance H is represented by a straight line (H=Lb−D). When difference D is larger than value Da in the case where difference D is included in the first region, imaging distance H is linked to the same state (i.e., distance Hmin in this case) regardless of difference D. Note that the aperture at the time of imaging corresponding to difference D in the first region is in the same state (here, the maximum aperture) regardless of whether difference D is equal to or less than value Db.

Next, the positional relationship between component camera 50 and component 90 in the case where imaging is performed with imaging distance H set in step S120 using the condition setting table of FIG. 4 and the aperture at the time of imaging will be described with reference to FIGS. 5 to 7. First, a case where difference D of component 90 satisfies 0≤D≤Db will be described with reference to FIG. 5. In this instance, CPU 61 uses the condition setting table to determine the aperture at the time of imaging as the largest aperture, and determines the value of imaging length H as a value determined based on the relation H=Lb−D. In this way, as shown in FIG. 5, imaging distance H is set so that the height of the imaging target portion (here, tip portion 92) coincides with the most focused position (i.e., the position at distance Lb from component camera 50) even within the depth of field in the case where the aperture is at the maximum aperture. As described above, when difference D satisfies 0≤D≤Db, that is, when difference D is particularly small in the first region and component camera 50 and the component do not easily interfere with each other, imaging distance H is determined so that the imaging target portion is included in the depth of field while the aperture at the time of imaging is set to the maximum aperture, and the imaging target portion is positioned at the position where the focusing of the imaging target portion is most clearly focused in the depth of field.

Next, a case where difference D of component 90 satisfies Db<D≤Da will be described with reference to FIG. 6. In this instance, CPU 61 uses the condition setting table to set the aperture at the time of imaging at the maximum aperture and to determine the value of imaging distance H as distance Hmin regardless of the value of difference D. In this way, as shown in FIG. 6, imaging distance H is set so that the height of the imaging target portion, here tip portion 92, falls within the depth of field in the case where the aperture is at the maximum aperture. Here, the case where difference D satisfies Db<D≤Da is a case where component camera 50 interferes with the component (here, the imaging distance H<distance Hmin) when the imaging target portion is positioned at the most focused position in the depth of field because difference D is relatively large in the first region. In such cases, CPU 61 sets imaging distance H so that the imaging target portion can be kept within the depth of field while the aperture at the time of imaging is set to the maximum aperture, although imaging distance H does not coincide with the position at which the imaging target portion is most focused.

Next, a case where difference D of component 90 satisfies Da<D will be described with reference to FIG. 7. In this instance, CPU 61 uses the condition setting table to set the aperture at the time of imaging to be a condition corresponding to difference D, and the value of imaging distance H is determined to be distance Hmin regardless of difference D. As shown in FIG. 4, the aperture at the time of imaging set here is reduced more than the aperture in the case where difference D is included in the first region (here, the maximum aperture). Therefore, as shown in FIG. 7, the depth of field (i.e., the range of the two-dot chain line in FIG. 7) when difference D satisfies Da<D is deeper than the depth of field (the range of the broken line in FIG. 7) in the case of the maximum aperture. In this way, as shown in FIG. 7, the aperture at the time of imaging is set so that the height of the imaging target portion, here tip portion 92, falls within the depth of field. Here, the case in which difference D satisfies Da<D is a case in which component camera 50 interferes with the component (here, imaging distance H<distance Hmin) when the imaging target portion is to be within the depth of field with the aperture set to the maximum aperture because difference D is relatively large. In such cases, CPU 61 sets an aperture at the time of imaging that allows the aperture to be reduced more than the maximum aperture, and allows the imaging target portion to fall within the depth of field. The correspondence between the step-function difference D shown in FIG. 4 and the aperture at the time of imaging is set in advance so that the imaging target portion may fall within the depth of field set by the aperture corresponding to difference D when imaging distance H is distance Hmin.

When imaging distance H and the aperture at the time of imaging are determined in step S120, the CPU 61 determines the light exposure time based on the determined aperture in step S130. Here, as the aperture is reduced, it is necessary to lengthen the light exposure time in order to compensate for the shortage of light per unit time. In step S130, the CPU 61 determines a light exposure time corresponding to the determined aperture based on a correlation between the aperture and a suitable light exposure time stored in advance in HDD 63. In the present embodiment, this correspondence is stored in HDD 63 in the form of a mathematical expression. However, the present disclosure is not limited to this, and a table in which the aperture and the light exposure time are linked to each other may be stored in HDD 63, and the light exposure time may be set based on this table. By performing steps S120 and S130, imaging distance H and imaging conditions (i.e., the aperture and light exposure time) of component camera 50 at the time of imaging are set.

Next, CPU 61 mounts the components in steps S140 to S180. That is, in step S140, CPU 61 first controls reel unit 70, X-axis slider 26, Y-axis slider 30, and Z-axis motor 34 so that the mounting target component supplied by reel unit 70 is gripped by gripping section 42 of mechanical chuck 40. Subsequently, CPU 61 causes Z-axis motor 34 to raise mechanical chuck 40 so that imaging distance H of the component held by mechanical chuck 40 becomes the value determined in step S120, and CPU 61 controls X-axis slider 26 and Y-axis slider 30 so that mechanical chuck 40 moves to a location above component camera 50 (step S150). For example, when the component supply position of feeder section 74 is higher than the height defined by imaging distance H, CPU 61 may raise mechanical chuck 40 to a height that does not interfere with feeder section 74 and then lower mechanical chuck 40 to imaging distance H. Next, when the component held by mechanical chuck 40 reaches a height directly above component camera 50 and defined by imaging distance H, CPU 61 causes component camera 50 to image the component under the set imaging conditions (i.e., aperture and light exposure time) (step S160). When component camera 50 captures an image, CPU 61 performs a predetermined process based on the captured image data (step S170). For example, based on the captured image data, CPU 61 detects the position of the imaging target portion (here, tip portion 92) in the component held by mechanical chuck 40 and sets the correction amount of the arrangement position at the time of arranging the component on board 16. In addition, for example, CPU 61 compares the imaging target portion in the captured image data with a normal imaging target portion stored in advance, thereby determining whether any connector pins 91 are missing. In order to perform such processing with high accuracy, it is necessary to focus on an imaging target portion in an image captured by component camera 50. In the present embodiment, since imaging distance H and the imaging conditions are set based on difference D of the components so that the imaging target portion falls within the depth of field, that is, the imaging target portion is in focus, an image focused on the imaging target portion can be obtained for various components having different differences D. When difference D satisfies 0≤D≤Db as described above, since imaging distance H and the imaging condition are determined so that the height of the imaging target portion coincides with the most focused position even within the depth of field, an image focused by the imaging target portion can be obtained. When processing based on image data is performed, CPU 61 moves mechanical chuck 40 to a predetermined mounting position of board 16 and places the component into that mounting position (step S180). At this time, when the correction amount based on the above-described image data is set, CPU 61 arranges the component at the mounting position while taking into account the correction amount. If a connector pin 91 is missing in step S170, CPU 61 may discard the component held by mechanical chuck 40 without performing step S180 and may execute the processes of step S140 and subsequent steps.

When the mounting target component is component 90, CPU 61 arranges component 90 on board 16 by, for example, inserting connector pins 91 of component 90 into holes in predetermined positions of board 16. Since component 90 has protruding section 94, the mounting position of component 90 is set near the outer edge of board 16 so that protruding section 94 does not interfere with board 16. That is, protruding section 94 and connector pins 93 of component 90 after mounting are located in an area other than on board 16.

Thereafter, CPU 61 determines whether mounting of all the components on board 16 has been completed in step S190 and if not, returns to step S100 to mount the remaining components. On the other hand, if the mounting of all the components has been completed in S190, the CPU 61 terminates the component mounting process routine.

Note that CPU 61 may be performed such that at least a part of the processes of steps S100 to S130 are performed in parallel with at least a portion of steps S140 to S150.

Here, the correspondence between the configuration elements of the present embodiment and the constituent elements of the present disclosure will be clarified. Mechanical chuck 40 of the present disclosure embodiment corresponds to the component holding section, component camera 50 corresponds to the imaging section, and CPU 61 of controller 60 corresponds to the controller. Z-axis motor 34 corresponds to a lifting and lowering section.

According to mounting device 10 of the present embodiment described in detail above, the CPU 61 determines the aperture and light exposure time so that the imaging target portion falls within the depth of field of component camera 50 based on information about the height of the imaging target portion in the component. For example, when difference D is included in the second region, the depth of field is changed in accordance with difference D so that imaging target portion falls within the depth of field of component camera 50. Component camera 50 is then controlled so as to image the component with the determined aperture and light exposure time. As described above, since imaging is performed by adjusting the depth of field based on the information about the height of the imaging target portion of the component, it is possible to obtain an image focused on the imaging target portion regardless of whether the height of the imaging target portion of the component matches the lowest portion of the component. That is, a suitable image of the component can be obtained.

Further, mounting device 10 includes Z-axis motor 34 that can adjust imaging distance H, which is the distance in the height direction at the time of imaging between the lowest portion of the component and component camera 50, by lifting and lowering the component held by mechanical chuck 40. Further, CPU 61 acquires information about the height of the imaging target portion including information about difference D between the height of the lowest portion of the component and the height of the imaging target portion. Then, when difference D is included in the first region, CPU 61 causes component camera 50 to perform imaging of the component under the imaging condition in which the aperture is more open and the light exposure time is shortened compared to the case in which difference D is included in the second region, and causes Z-axis motor 34 to adjust imaging distance H so that the imaging target portion falls within the depth of field of the imaging condition. When difference D is included in the second region, CPU 61 determines the imaging condition so that the imaging target portion falls within the depth of field of component camera 50, and causes component camera 50 to image the component under the determined imaging condition. Accordingly, when difference D is included in the first region, i.e., when difference D is relatively small, imaging distance H is adjusted by Z-axis motor 34, so that the imaging target portion may fall within the depth of field even in a state where the depth of field is relatively shallow. Therefore, it is possible to capture an image in a state in which the depth of field is made relatively shallow, that is, in an imaging condition in which the light exposure time can be made relatively short, which enables to obtain the image at high speed. On the other hand, when difference D is included in the second region (i.e., when the difference is relatively large), since the imaging of the component is performed with the aperture being reduced and the light exposure time being lengthened, the imaging target portion may fall within the depth of field, even when the lowest portion of the component may interfere with component camera 50 by merely relying on adjustment of imaging distance H by Z-axis motor 34. Therefore, even when difference D is large, an image focused on the imaging target portion can be obtained more reliably.

Further, when difference D is included in the first region, CPU 61 controls component cameras 50 so as to image the components with the aperture and the light exposure time being the same regardless of difference D. That is, when difference D is included in the first region, the imaging condition corresponding to difference D is not adjusted, and the imaging target portion is set to the depth of field only by the control of Z-axis motor 34. Thus, when difference D is included in the first region, the light exposure time can be shortened as much as possible regardless of the magnitude of difference D, and an image can be obtained at high speed. For example, the depth of field may be adjusted in accordance with difference D, for example, by setting the imaging condition so that the aperture at the time of imaging becomes smaller as difference D becomes larger in the first region of FIG. 4, but in such a case, the exposure time becomes longer as difference D becomes larger. In the present embodiment, compared with such a case, the exposure time can be shortened as much as possible regardless of the magnitude of difference D. In particular, in the present embodiment, when difference D is included in the first region, since the aperture is set to maximum aperture and the exposure time is shortest regardless of difference D, an image can be obtained at a higher speed.

Furthermore, when difference D is included in the second region, CPU 61 causes Z-axis motor 34 to adjust imaging distance H so that imaging distance H is equal to or less than the smallest value of imaging distance H when difference D is included in the first region, here, the distance Hmin. Therefore, since Z-axis motor 34 makes imaging distance H relatively small even when the difference is included in the second region, even when difference D is relatively large, the imaging target portion may fall within the depth of field without making the depth of field as large as possible, that is, without making the exposure time as long as possible. For example, CPU 61 may set imaging distance H to be a value larger than distance Hmin when difference D is included in the second region, but in this case, the aperture needs to be reduced to increase a depth of field by an amount corresponding to the increase in imaging distance H, while the exposure time is determined to be a value longer by that amount. When difference D is included in the second region, by adjusting imaging distance H so as to be equal to or less than the minimum value of imaging distance H in the case where difference D is included in the first region, such lengthening of the exposure time can be suppressed. In particular, in the present embodiment, when difference D is included in the first region, since the value of imaging distance H is set to distance Hmin which is the lower limit of imaging distance H at which the interference between component camera 50 and the component is avoided, the imaging target portion may fall in the depth of field while minimizing the exposure time within the range in which interference is avoided.

The present disclosure is not limited in any way to the above-mentioned embodiments, and it is needless to say that the present disclosure can be implemented in various forms as long as it belongs to the technical scope of the present disclosure.

For example, in the embodiment described above, when difference D is equal to or less than difference Db, CPU 61 determines imaging distance H so that the height of the imaging target portion coincides with the most focused position even within the depth of field when the aperture is at maximum aperture, but the present disclosure is not limited thereto. Even when difference D is equal to or smaller than difference Db, CPU 61 may determine imaging distance H such that imaging distance H is included in the depth of field of the imaging target portion. For example, even when difference D is equal to or less than value Db, the aperture at the time of imaging may be set as the largest aperture and the value of imaging distance H may be set as distance Hmin regardless of the value of difference D. In the embodiment described above, as shown in FIG. 6, the lowest end of the component (i.e., the lower end of protrusion 94 in FIG. 6) falls within the depth of field when imaging distance H is distance Hmin and the aperture is the largest aperture. On the other hand, the depth of field at maximum aperture is shallower than the depth of field in FIG. 6, and the lowest portion of the component (i.e., the lower end of protrusion 94 in FIG. 6) may not fall within the depth of field. In such cases, if imaging distance H is determined to be distance Hmin when difference D is too small in the first region, the imaging target portion deviates from the depth of field toward component camera 50. In such a case, when difference D is too small, CPU 61 may set imaging distance H to be larger than distance Hmin by the amount of difference D so that the imaging target portion falls within the depth of field. Alternatively, when difference D is too small, CPU 61 may reduce the aperture to increase the depth of field by an amount corresponding to difference D so that the imaging target portion falls within the depth of field. However, in order to obtain an image at high speed, it is preferable that CPU 61 changes imaging distance H without reducing the aperture as much as possible, so that the imaging target portion falls within the depth of field. Further, an area in which difference D is too small as described above may be regarded as a third region different from the first region.

In the embodiment described above, CPU 61 obtains, in step S100, the information about the imaging target portion height of the component and the information about the height of the lowest portion, and derives difference D in step S110, but difference D is not limited to this. For example, CPU 61 may obtain difference D for a mounting target component directly from management computer 80 instead of deriving difference D. When CPU 61 obtains difference D directly, it is preferable that CPU 61 also obtains information about the height of the component.

In the embodiments described above, the height of component camera 50 is fixed and CPU 61 adjusts imaging distance H by lifting and lowering the component with Z-axis motor 34, but it suffices to adjust imaging distance H by lifting and lowering at least one of the component held by mechanical chuck 40 and component camera 50. For example, as shown in FIG. 8, height adjustment mechanism 59 may be disposed below component camera 50, and CPU 61 may adjust imaging distance H by lifting and lowering component camera 50 with height adjustment mechanism 59.

In the embodiment described above, CPU 61 determines imaging distance H and the aperture at the time of imaging based on the condition setting table of FIG. 4, but the present disclosure is not limited thereto. It suffices if imaging distance H and the aperture at the time of imaging can be set based on difference D, for example, HDD 63 may store a mathematical equation (i.e., a conversion equation) instead of the condition setting table.

In the above-described embodiment, mounting device 10 has mechanical chuck 40 for gripping components but is not limited to this provided components can be held. For example, instead of mechanical chuck 40, mounting device 10 may include a suction nozzle that picks up and holds components by suction.

In the embodiment described above, the imaging condition is determined by controller 60, but the present disclosure is not limited to this, and for example, imaging control section 57 may determine the imaging condition by receiving the value of difference D from controller 60. Of the imaging conditions, the aperture may be determined by controller 60, and the exposure time corresponding to the determined aperture may be determined by imaging control section 57.

In the embodiment described above, the case where the difference D is included in the first region and the case where the difference D is included in the second region are distinguished from each other, but the cases don't have to be distinguished. For example, regardless of whether difference D is included in the first region or the second region, the imaging condition may be changed so that the imaging target portion can be included in the depth of field based on difference D. However, in order to obtain an image at high speed, it is preferable that CPU 61 changes imaging distance H as much as possible without reducing the aperture to the extent that the imaging target portion falls within the depth of field, and changes the imaging condition when falling the imaging target portion within the depth of field may be difficult only by relying on the change of imaging distance H.

In the embodiment described above, component camera 50 is not limited to capturing an image from beneath the component, and may capture images from above the component. In this case, the distance in the height-direction between the highest portion of the component and component camera 50 is the imaging distance H. Further, the difference between the highest portion of the component and the height of the imaging target portion height becomes difference D, and CPU 61 may obtain information about difference D as information about the imaging target portion height.

In the embodiment described above, CPU 61 acquired information about the height of the imaging target portion including difference D between the height of the lowest portion of the component and the height of the imaging target portion of the component, but difference D is not limited to this and information about the height of the imaging target portion in the component may be acquired. For example, consider a case where the lowest portion of the component does not interfere with component camera 50 in a state in which the imaging target portion in the component falls within the depth of field, such as a case in which difference D is relatively small in the above-described embodiment. In such cases, CPU 61 may obtain information about the height of the imaging target portion including the height of imaging target portion of the component at the time of imaging without obtaining information about the height of the lowest portion of the component, and may determine the aperture and the exposure time so that the imaging target portion falls within the depth of field based on the obtained height of the imaging target portion.

INDUSTRIAL APPLICABILITY

The present disclosure can be applied to a mounting device for mounting a component on a board.

DESCRIPTION OF REFERENCE SIGNS

10 Mounting device, 12 Base, 14 Mounting device main body, 16 Board, 18 Board conveyance device, 20 Support plate, 22 Conveyor belt, 23 Support pins, 24 Head, 26 X-axis slider, 26a Driving motor, 28 Guide rail, 30 Y-axis slider, 30a Driving motor, 32 Guide rail, 34 Z-axis motor, 36 Ball screw, 40 Mechanical chuck, 41 Chuck main body, 42 Gripping sections, 43 Driving motor, 50 Component camera, 51 Light section, 52 Camera main body, 53 Lens, 54 Aperture mechanism, 55 Shutter mechanism, 56 Imaging element, 57 Imaging control section, 59 Height adjustment mechanism, 60 Controller, 61 CPU, 62 ROM, 63 HDD, 64 RAM, 65 Input/output interface, 66 Bus, 70 Reel unit, 72 Reel, 74 Feeder section, 80 Management computer, 90 Component, 91 Connector pins, 92 Tip portion, 93 Connector pins, 94 Protruding section.

The invention claimed is:

1. A mounting device, comprising:
a component holding section capable of holding a component;
an imaging section capable of imaging a component held in the component holding section from above or below and capable of adjusting an aperture and a light exposure time at the time of imaging;
a control section configured to obtain information about height of an imaging target portion of the component, determine imaging conditions related to the aperture and the light exposure time so that the imaging target portion falls within the depth of field of the imaging section based on the obtained information, and control the imaging section so as to image the component under the determined imaging conditions; and
a lifting and lowering section capable of adjusting an imaging distance, which is a distance at the time of imaging in the height direction from the component end portion of the imaging section side to the imaging section, by lifting and lowering at least one of the component held by the component holding section and the imaging section;
wherein the control section obtains at least information about difference between the height of the component end portion on the imaging section side and the height of the imaging target portion as information on the height of the imaging target portion; and in a case that the difference based on the obtained information is included in a first region, among a first region and a second region with a larger difference being included, the control section controls the image section to capture an image of the component under an imaging condition in which the aperture is more opened and the light exposure time is shorter than a case of the difference being in the second region, and controls the lifting and lowering section to adjust the imaging distance so that the imaging target portion falls within the depth of field of the imaging condition; and if the difference is included in the second region, the control section determines the imaging condition so that the imaging target portion falls within the depth of field of the imaging section, and controls the imaging section to capture an image of the component under the determined imaging condition.

2. The mounting device according to claim 1, wherein, when the difference is included in the first region, the control section controls the imaging section so as to image the component with the aperture and the light exposure time being the same regardless of the difference.

3. The mounting device according to claim 1, wherein, when the difference is included in the second region, the control section controls the lifting and lowering section so as to adjust the imaging distance such that the difference is equal to or less than the minimum value of the imaging distance when the difference is included in the first region.

* * * * *